(12) United States Patent
Tanaka et al.

(10) Patent No.: US 11,552,073 B2
(45) Date of Patent: Jan. 10, 2023

(54) SEMICONDUCTOR DEVICE

(71) Applicant: Mitsubishi Electric Corporation, Tokyo (JP)

(72) Inventors: Sho Tanaka, Tokyo (JP); Tomohide Terashima, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/453,530

(22) Filed: Nov. 4, 2021

(65) Prior Publication Data

US 2022/0246603 A1    Aug. 4, 2022

(30) Foreign Application Priority Data

Feb. 4, 2021    (JP) .............................. JP2021-016596

(51) Int. Cl.
*H01L 27/02*        (2006.01)
*H03K 17/082*       (2006.01)
*H02H 9/02*         (2006.01)

(52) U.S. Cl.
CPC ...... *H01L 27/0292* (2013.01); *H01L 27/0255* (2013.01); *H01L 27/0259* (2013.01); *H01L 27/0266* (2013.01); *H01L 27/0288* (2013.01); *H02H 9/025* (2013.01); *H03K 17/0828* (2013.01)

(58) Field of Classification Search
CPC ............. H01L 27/0255; H01L 27/0259; H01L 27/0266; H01L 27/0288; H01L 27/0292; H03K 17/0828; H02H 9/025

USPC .......................................................... 361/57
See application file for complete search history.

(56) References Cited

U.S. PATENT DOCUMENTS

| 5,844,760 A * | 12/1998 | Kumagai | ........... H03K 17/0822 361/18 |
| 5,903,034 A * | 5/1999 | Sakamoto | ........... H01L 27/0629 257/379 |
| 2002/0167056 A1* | 11/2002 | Sakamoto | ........ H03K 17/04206 257/E27.017 |

FOREIGN PATENT DOCUMENTS

| GB | 2549934 A | * 11/2017 | ............... G01K 7/01 |
| JP | H10-145206 A | 5/1998 | |
| JP | H11-097679 A | 4/1999 | |
| WO | WO-9305557 A1 | * 3/1993 | ........ H02M 7/53803 |

* cited by examiner

*Primary Examiner* — Kevin J Comber
(74) *Attorney, Agent, or Firm* — Studebaker & Brackett PC

(57) ABSTRACT

A semiconductor device includes a main IGBT, a sense, a resistor, a MOSFET and a diode, as main components. The sense IGBT and the main IGBT are connected in parallel with each other. The drain of MOSFET is connected to the gate of the sense IGBT, the source thereof is connected to the gate of the main IGBT, and the gate thereof is connected to the emitter of the sense IGBT and the cathode of diode. One end of the resistor is connected to the gate of the main IGBT and the source of the MOSFET, and the other end of the resistor is connected to the emitter of the main IGBT and the anode of the diode.

5 Claims, 10 Drawing Sheets

F I G. 1 0
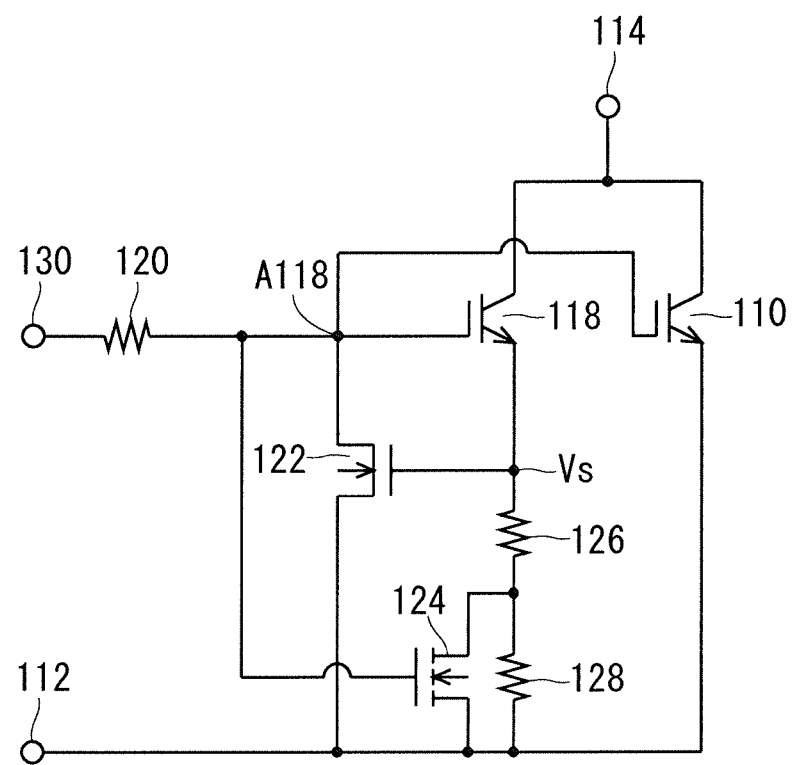

SEMICONDUCTOR DEVICE

BACKGROUND OF THE INVENTION

Field of the Invention

The present disclosure relates to a semiconductor device having a function of protecting a power switching element from an overcurrent state.

Description of the Background Art

In a semiconductor device having a power switching element such as a power transistor having a switching function, a method is adopted in which the amount of current is reduced only at the time of short circuit and a high energization capacity is maintained at the time of non-short circuit to achieve both a long non-destructive short circuit time and low loss.

As a semiconductor device adopting the above method, for example, there is a protection circuit of the semiconductor device disclosed in Japanese Patent Application Laid-Open No. 10-145206. In this protection circuit, a method is adopted in which an element having a current sense function is provided between the chip cell portion and the cell portion to detect a state in which an excess current flows due to a short circuit.

Specifically, the structure is provided in which, when an excess current is applied, feedback control is performed so as to suppress the gate voltage of the power transistor, being subject to the control, based on the signal using the current sensors arranged in parallel to limit the current flowing through the power transistor. In Japanese Patent Application Laid-Open No. 10-145206, the protection circuit is monolithically constructed to control the gate voltage of the power switching element.

However, in the protection circuit disclosed in Japanese Patent Application Laid-Open No. 10-145206, there has been a problem that burning of the resistor and damaging of the gate driver can possibly occur due to the reverse current flowing through the parasitic diode in the MOSFET constituting the protection circuit when a negative drive voltage is applied to the gate of the power transistor.

The gate driver is a drive voltage applying means that applies a gate voltage as a drive voltage, and the gate resistor is a resistor for transmitting the gate voltage. Also, the parasitic diode in the MOSFET is referred to a body diode in some cases.

SUMMARY

The object is to obtain a semiconductor device that protects a power switching element from an overcurrent state and suppresses a reverse current generated when a negative drive voltage is applied.

The semiconductor device of the present disclosure includes a first power switching element, a second power switching element, a first diode, a first MOSFET, and a charge discharge circuit.

The first power switching element is an n-channel type and has one electrode, an other electrode and a control electrode.

The second power switching element is the n-channel type and has one electrode, an other electrode and a control electrode, in which the one electrode is connected to the one electrode of the first power switching element.

In the first diode, an anode thereof is connected to the other electrode of the first power switching element, and a cathode thereof is arranged in a direction toward the other electrode of the second power switching element.

The first MOSFET is the n-channel type, has one electrode, an other electrode and a control electrode, in which the one electrode thereof receives a drive voltage for the first power switching element and the second power switching element, the one electrode thereof is connected to the control electrode of the second power switching element, the other electrode thereof is connected to the control electrode of the first power switching element, and the control electrode thereof is connected to the other electrode of the second power switching element.

The charge discharge circuit is provided from the control electrode to the other electrode of the first power switching element.

In the semiconductor device of the present disclosure, when an overcurrent is flowing in the first power switching element, a first control voltage applied to the control electrode of the first power switching element is high.

Therefore, when an overcurrent flows through first power switching element, the potential difference between the control electrode and the other electrode of the first MOSFET inclines to become smaller, and the ON state of the first MOSFET is weaken. As the ON state of the first MOSFET becomes weaker, the excess charge accumulated at the control electrode of the first power switching element is discharged to the outside of the other electrode side of the first power switching element via the charge discharge path in the charge discharge circuit.

As a result, the semiconductor device of the present disclosure ensures the reduction in the amount of current flowing through the first power switching element by lowering the first control voltage swiftly, during the overcurrent state.

When a negative drive voltage is applied, a phenomenon is assumed in which a reverse current flows from the other electrode of the first power switching element to a drive voltage applying means for applying the drive voltage through a parasitic diode in the first MOSFET.

The charge discharge circuit in the semiconductor device of the present disclosure has the charge discharge path from the control electrode to the other electrode of the first power switching element. Therefore, the charge discharge path is present between the other electrode of the first MOSFET and the other electrode of the first power switching element.

Therefore, the semiconductor device of the present disclosure, even when the negative drive voltage is applied, the presence of the charge discharge circuit ensures the suppression of the phenomenon of the reverse current flowing through the parasitic diode in the first MOSFET.

These and other objects, features, aspects and advantages of the present invention will become more apparent from the following detailed description of the present invention when taken in conjunction with the accompanying drawings.

BRIEF DESCRIPTION OF THE DRAWINGS

FIG. 10 is a circuit diagram illustrating a circuit configuration equivalent to a protection circuit of a semiconductor device, which is a basic technique.

DESCRIPTION OF THE PREFERRED EMBODIMENTS

Introduction

Figure 1:
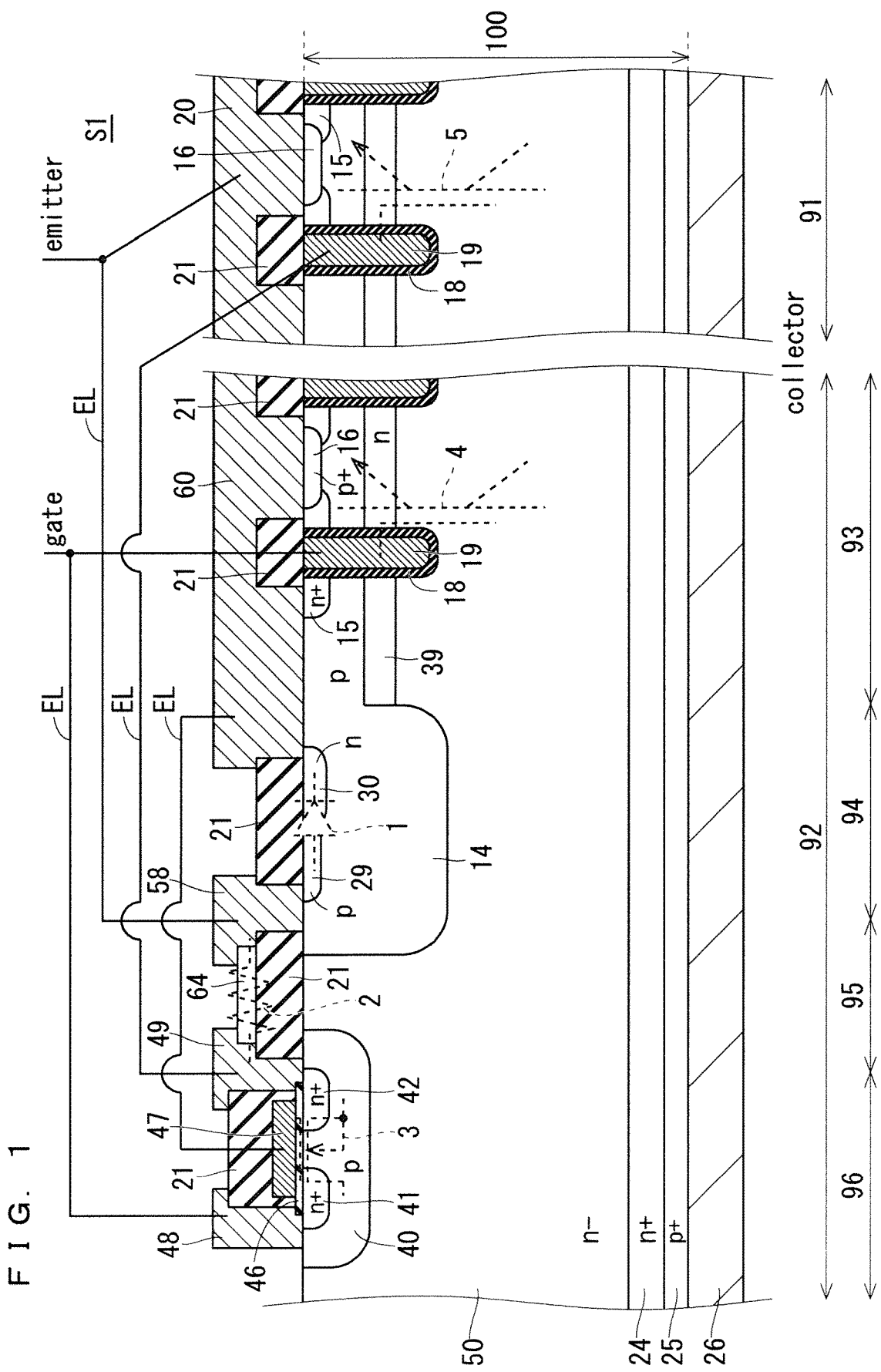
FIG. 1 is a cross-sectional view illustrating a cross-sectional structure of a semiconductor device according to Embodiment 1.

The present disclosure is intended for a semiconductor device that controls a current flowing through a power switching element by changing the voltage of a control electrode of the power switching element. In the following descriptions of Embodiments, a trench-type insulated gate bipolar transistor (IGBT) will be used as the power switching element.

The term "MOS" has long been used for a laminated structure of metal/oxide/semiconductor, and is an acronym for Metal-Oxide-Semiconductor. However, especially in the field effect transistor having a MOS structure (hereinafter, simply referred to as "MOSFET"), improvement has been seen in the materials of the gate insulating film and the gate electrode, from the viewpoint of integration and improvement in the manufacturing process in recent years.

Therefore, the term "MOS" is not necessarily used only for the metal/oxide/semiconductor laminated structure, and the present specification does not presuppose such limitation. That is, in view of common general knowledge, "MOS" here has a meaning including not only as an acronym derived from the etymology but also broadly as a laminated structure of a conductor/insulator/semiconductor.

Basic Technique

FIG. 10 is a circuit diagram illustrating a circuit configuration equivalent to a protection circuit of a semiconductor device, which is a basic technique disclosed in Japanese Patent Application Laid-Open No. 10-145206. In FIG. 10, as a semiconductor device of basic technique, for example, a main IGBT 110 constituting an arm of an inverter is provided, an emitter of the main IGBT 110 is connected to an emitter electrode terminal 112, and a collector thereof is connected to a collector electrode terminal 114.

An overcurrent protection circuit is provided to protect a main IGBT 110 from overcurrent. The overcurrent protection circuit includes a detection IGBT 118, a gate resistor 120, transistors 122 and 124 composed of an n-type MOSFET, a detection resistor 126, and an auxiliary detection resistor 128.

The detection IGBT 118 is connected in parallel with the main IGBT 110, the collector thereof is connected to a collector electrode terminal 114, the gate thereof is connected to the gate of the main IGBT 110, and is connected to a gate electrode terminal 130 via a gate resistor 120, and the emitter thereof is connected to one end of a detection resistor 126 and the gate of a transistor 122.

A gate voltage, which is a drive voltage, is applied to the gate electrode terminal 130 by a drive voltage applying means such as a gate driver (not illustrated). This voltage below is referred to as the drive gate voltage.

The drain of the transistor 122 is connected to the gate of the detection IGBT 118, and the source thereof is connected to the emitter electrode terminal 112. The transistor 122 is in the ON state only when the gate voltage Vs exceeds the threshold voltage, and is configured as an overcurrent protection means that lowers the driving gate voltage at a point A118 to reduce the energizing current of the main IGBT 110 and the energizing current of the detected IGBT 118 and as a voltage control means that lowers the level of the drive gate voltage at the point A118 according to the gate voltage Vs.

The detection resistor 126 and the auxiliary detection resistor 128 are connected in series between the emitter of the detection IGBT 118 and the emitter electrode terminal 112, detect the current flowing through the detection IGBT 118, and constitute a current-voltage conversion means that converts the detected current into a voltage corresponding to the resistor value.

The semiconductor device of the basic technique having such a configuration performs an overcurrent protection operation as follows. When an excessive main current flows through the main IGBT 110, the current flowing through the detection IGBT 118 also increases, and the detection voltage detected by the detection resistor 126 also increases. When the gate voltage Vs, which is the detection voltage, exceeds the threshold voltage of the transistor 122, the transistor 122 is turned ON and the drive gate voltage at point A118 drops. In this manner, the drive gate voltage decreases according to the magnitude of the gate voltage Vs applied to the gate of the transistor 122. When the drive gate voltage at point A118 decreases, the current of the main current of the main IGBT 110 and the current of the detected IGBT 118 also decreases as the drive gate voltage decreases.

As described above, the semiconductor device of the basic technique can reduce the current flowing through the main IGBT 110 during the overcurrent state by the above-mentioned overcurrent protection circuit.

Next, consider the case where a negative drive gate voltage is applied as the drive voltage applied to the gate electrode terminal 130. In this case, there is a problem that a reverse current flows from the emitter electrode terminal 112 set to the reference potential such as the GND potential toward the gate electrode terminal 130 via the parasitic diode in the transistor 122 and the gate resistor 120.

A flow of non-negligible level of reverse current has the risk that adversely affects the drive voltage applying means for applying the drive voltage from the gate electrode terminal 130 and the gate resistor 120 as an external resistor.

Semiconductor devices S1 to S3 of Embodiments 1 to 3 described below are provided with an overcurrent protection function and a function of suppressing a reverse current flowing when a negative drive voltage is applied.

Embodiment 1

Figure 2:
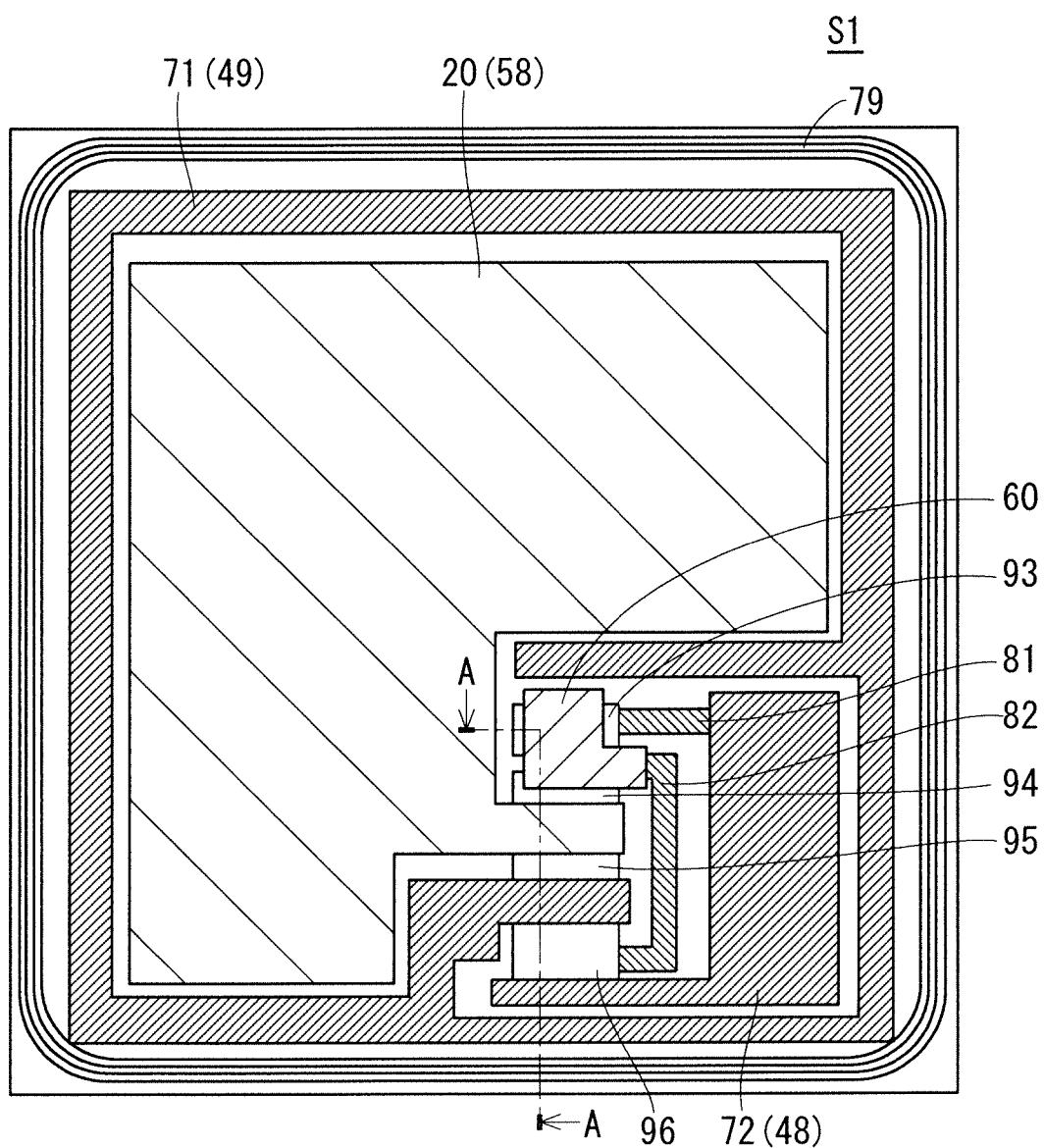
FIG. 2 is a plan view illustrating a plan structure of the semiconductor device according to Embodiment 1.

FIG. 1 is a cross-sectional view illustrating a cross-sectional structure of a semiconductor device according to Embodiment 1. FIG. 2 is a plan view illustrating a plan structure of the semiconductor device of according to Embodiment 1. The cross-section A-A of FIG. 2 is illustrated in FIG. 1.

In FIG. 2, for convenience of explanation, an interlayer insulating film 21, a gate electrode 47, and a polysilicon layer 64 are omitted.

As illustrated in FIG. 1, a semiconductor substrate 100 includes a range from a drift layer 50 including a base layer 40 and a base layer 14 to a collector layer 25 from the upper side toward the lower side. The semiconductor substrate 100 of a semiconductor device S1 is classified into a main region 91 and an auxiliary region 92, and the auxiliary region 92 is further classified into a sense region 93, a diode region 94, a resistor region 95, and a transistor region 96.

In FIG. 1, the upper end of the drift layer 50 on the paper surface including the base layer 40 and the base layer 14 is referred to as a first main surface of the semiconductor substrate 100, and the lower end of the collector layer 25 on the paper surface is referred to as a second main surface of the semiconductor substrate 100. The first main surface of the semiconductor substrate 100 is the main surface on the front surface side of the semiconductor device S1, and the second main surface of the semiconductor substrate 100 is the main surface on the rear surface side of the semiconductor device S1.

The drift layer 50, a buffer layer 24, the collector layer 25, and a collector electrode 26 are provided in the entire region of the semiconductor substrate 100.

The buffer layer 24 is provided adjacent to the second main surface side of the first conductive type n-type drift layer 50. The buffer layer 24 exhibits an $n^+$ type in which the concentration of n-type impurities is higher than that of the drift layer 50.

The collector layer 25 is provided adjacent to the second main surface side of the buffer layer 24. The collector layer 25 exhibits a $p^+$ type having a relatively high impurity concentration of the p-type, which is the second conductive type. The collector electrode 26 is provided on the second main surface of the collector layer 25.

The base layer 40 and the base layer 14 are selectively provided on the first main surface side in the drift layer 50. Both the base layer 40 and the base layer 14 exhibit the p-type. The base layer 40 is provided in the transistor region 96, and the base layer 14 is provided from a part of the resistor region 95 over the diode region 94, the sense region 93, and the main region 91. The base layer 14 is provided so that the formation depth of the region thereof from a part of the resistor region 95 to the diode region 94 is deeper than the formation depth of the region thereof from the sense region 93 to the main region 91.

A drain region 41 and a source region 42 are selectively provided on the first main surface side in the base layer 40. The drain region 41 and the source region 42 exhibit the $n^+$ type having a relatively high concentration of n-type impurities. A gate electrode 47 is provided on the first main surface of the base layer 40 between the drain region 41 and the source region 42 via a gate insulating film 46.

The n-channel type MOSFET 3 is configured with the above-mentioned base layer 40, the drain region 41, the source region 42, the gate insulating film 46, and the gate electrode 47 as main components.

In the diode region 94, a p-type anode region 29 and an n-type cathode region 30 are provided adjacent to each other on the first main surface side in the base layer 14. A diode 1 is configured with the above-mentioned anode region 29 and cathode region 30 as the main components.

The carrier store layer 39 adjacent to the second main surface side of the base layer 14 is provided in the main region 91 and the sense region 93 of the auxiliary region 92. The carrier store layer 39 exhibits the n-type, and the impurity concentration of the n-type is set higher than that of the drift layer 50. The carrier store layer 39 is provided so that the formation depth thereof is shallower than that of the base layer 14 in the diode region 94.

In the main region 91 and the sense region 93, a plurality of trenches are formed from the first main surface of the semiconductor substrate 100, extending through the base layer 14 and the carrier store layer 39, and reaching the drift layer 50. A gate electrode 19 serving as an embedded gate electrode is provided in each of the plurality of trenches via an insulating film 18 serving as a gate trench insulating film.

In the main region 91 and the sense region 93, a plurality of $n^+$ source regions 15 are provided on the first main surface side in the base layer 14. Each of the plurality of $n^+$ source regions 15 is provided adjacent to the corresponding insulating film 18 of the plurality of insulating films 18.

A $p^+$ diffusion region 16 is provided on the first main surface side in the base layer 14 between the gate electrodes 19 adjacent to each other. The $p^+$ diffusion region 16 is provided so as to be in contact with each of the pair of $n^+$ source regions 15 present on both sides thereof.

The sense IGBT 4 and the main IGBT 5 are respectively configured with the above-mentioned drift layer 50, the buffer layer 24, the collector layer 25, the carrier store layer 39, the base layer 14, the $n^+$ source region 15, the $p^+$ diffusion region 16, the insulating film 18, and the gate electrode 19 as the main components thereof. The sense IGBT 4 and the main IGBT 5 are n-channel type IGBTs, respectively. The main IGBT 5 provided in the main region 91 is an n-channel type first power switching element, and the sense IGBT 4 provided in the sense region 93 is an n-channel type second power switching element.

Further, in the transistor region 96, an interlayer insulating film 21 is provided so as to cover the gate electrode 47. In the resistor region 95, the interlayer insulating film 21 is provided on the first main surface of the drift layer 50 between the base layer 40 and the base layer 14. In the diode region 94, the interlayer insulating film 21 is provided on the first main surface of the anode region 29 and the cathode region 30. In the sense region 93 and the main region 91, the interlayer insulating film 21 is provided on the first main surface of the plurality of insulating films 18 and the plurality of gate electrodes 19.

In the resistor region 95, a polysilicon layer 64 having conductivity is provided on the interlayer insulating film 21. The polysilicon layer 64 functions as a resistor 2. The single resistor 2 constitutes a charge discharge circuit, and the resistor 2 per se serves as a charge discharge path provided from the gate to the collector of the main IGBT 5.

Then, a drain electrode 48, a source electrode 49, an anode electrode 58, an emitter electrode 60 and an emitter electrode 20 are provided on the first main surface of the semiconductor substrate 100.

The drain electrode 48 is provided from a part of the base layer 40 to a part of the drain region 41, and the source electrode 49 is provided from a part of the source region 42 to a part of the base layer 40 and one end portion of the polysilicon layer 64. Therefore, the drain electrode 48 is electrically connected to the drain region 41, and the source electrode 49 is electrically connected to the source region 42 and the polysilicon layer 64.

The anode electrode 58 is provided from an other end portion of the polysilicon layer 64 over a part of the base layer 14 to a part of the anode region 29. Therefore, the anode electrode 58 is electrically connected to the polysilicon layer 64 and the anode region 29.

The emitter electrode 60 is provided from a part of the cathode region 30 to the entire region of the sense region 93. Therefore, the emitter electrode 60 is electrically connected to the cathode region 30 and is electrically connected to the $n^+$ source region 15 and the $p^+$ diffusion region 16 in the sense region 93.

The emitter electrode 20 is provided in the entire region of the main region 91. Therefore, the emitter electrode 20 is electrically connected to the $n^+$ source region 15 and the $p^+$ diffusion region 16 in the main region 91.

As illustrated in FIG. 1, the semiconductor device S1 has an electrical connection relationship indicated by electrical connection lines EL among the drain electrode 48, the gate electrode 47, the source electrode 49, the anode electrode 58, the emitter electrode 60, the emitter electrode 20, the gate electrode 19 in the sense region 93, and the gate electrode 19 in the main region 91. Aluminum is used as a constituent material of the above-mentioned electrodes, for example.

The electrical connection lines EL are virtual lines schematically illustrating the electrical connection relationship between the electrodes, and is illustrated so as to connect the electrodes having the electrical connection relationship. It should be noted that the plurality of gate electrodes 19 provided in each of the sense region 93 and the main region 91 are represented by respective one gate electrode 19. That is, the plurality of gate electrodes 19 in the main region 91 are electrically connected to each other, and the gate electrodes 19 in the sense region 93 are electrically connected to each other.

As illustrated in FIG. 1, the drain electrode 48 and the gate electrode 19 in the sense region 93 are electrically connected. The gate electrode 47 and the emitter electrode 60 are electrically connected. The source electrode 49 and the gate electrode 19 of the main region 91 are electrically connected. The anode electrode 58 and the emitter electrode 20 are electrically connected.

As illustrated in FIG. 2, a part of the emitter electrode 20 extends over the diode region 94, thereby also serving as a function of the anode electrode 58 illustrated in FIG. 1. That is, the emitter electrode 20 and the anode electrode 58 are integrally provided.

Further, although most of a gate pulling up portion 71 is provided along the outer circumference of the emitter electrode 20, a part of the gate pulling up portion 71 extends above the resistor region 95 and the transistor region 96, thereby also functioning as the source electrode 49 illustrated in FIG. 1. The gate pulling up portion 71 is electrically connected to the plurality of gate electrodes 19 in the main region 91.

Further, in terms of a gate pad 72, the main part thereof is formed in the lower right region in the diagram and a part thereof extends over the transistor region 96, thereby also functioning as the drain electrode 48 illustrated in FIG. 1.

Further, as illustrated in FIG. 2, by providing a wiring layer 81 between the sense region 93 and the gate pad 72, the gate pad 72 and the gate electrode 19 of the sense region 93 are electrically connected via the wiring layer 81.

Further, a wiring layer 82 is provided between the emitter electrode 60 and the transistor region 96. Therefore, the emitter electrode 60 in the sense region 93 and the gate electrode 47 in the transistor region 96 are electrically connected via the wiring layer 82.

Further, as illustrated in FIG. 2, a guard ring 79 is provided along the outer circumference of the gate pulling up portion 71. The guard ring 79 is provided to cut off the electrical connection between the semiconductor device S1 and the outside.

Figure 3:
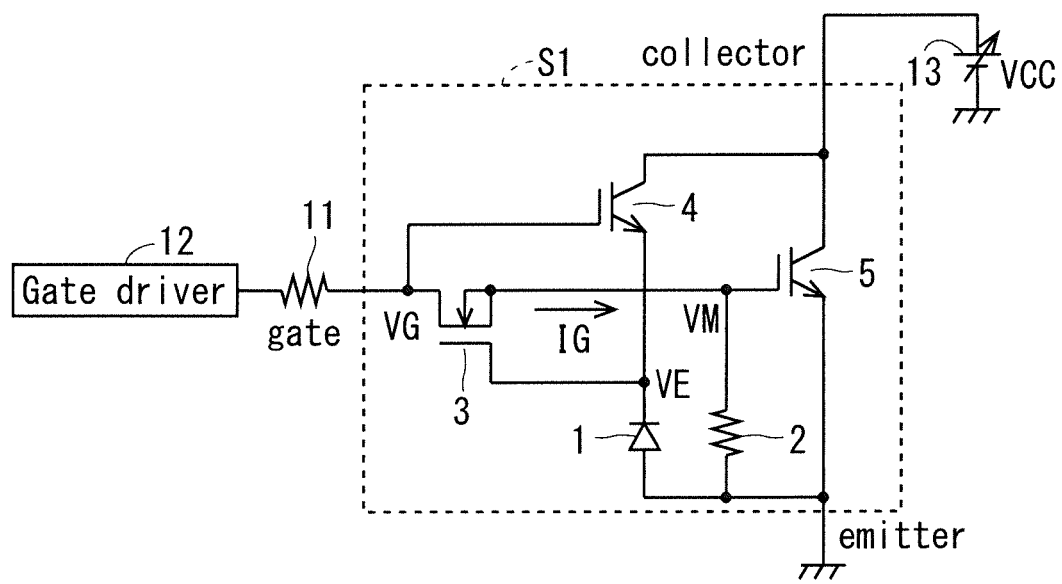
FIG. 3 is a circuit diagram illustrating a circuit configuration of the semiconductor device according to Embodiment 1.

FIG. 3 is a circuit diagram illustrating a circuit configuration of the semiconductor device S1 illustrated in FIGS. 1 and 2. Hereinafter, the circuit configuration of the semiconductor device S1 will be described with reference to FIG. 3. The semiconductor device S1 includes, as the main components, the main IGBT 5 being a first power switching element, the sense IGBT 4 being a second power switching element, the resistor 2 being a first resistor, the n-type MOSFET 3 being a first MOSFET, and the diode 1 being a first diode. The single resistor 2 constitutes the charge discharge circuit.

The sense IGBT 4 and the main IGBT 5 each have a collector as one electrode, an emitter as an other electrode, and a gate as a control electrode.

Hereinafter, regarding the semiconductor device S1 of Embodiment 1, the correspondence of electrodes between the device structure illustrated in FIGS. 1 and 2, the circuit configuration illustrated in FIG. 3 will be described.

For the main IGBT 5, the emitter thereof corresponds to the emitter electrode 20, the gate thereof corresponds to the gate electrode 19 in the main region 91, and the collector thereof corresponds to the collector electrode 26. For the sense IGBT 4, the emitter thereof corresponds to the emitter electrode 60, the gate thereof corresponds to the gate electrode 19 in the sense region 93, and the collector thereof corresponds to the collector electrode 26.

The MOSFET 3 has a drain as one electrode, a source as an other electrode, and a gate as a control electrode. For MOSFET 3, the drain corresponds to the drain electrode 48, the gate corresponds to the gate electrode 47, and the source corresponds to the source electrode 49.

For diode 1, the anode corresponds to the anode electrode 58 and the cathode corresponds to the emitter electrode 60.

The sense IGBT 4 and the main IGBT 5 are connected in parallel with each other. That is, the collectors of the sense IGBT 4 and the main IGBT 5 are commonly connected, and the emitter of the sense IGBT 4 is connected to the emitter of the main IGBT 5 via the diode 1.

At the practical level, the semiconductor device S1 applies a gate voltage VG being a drive voltage, from the gate driver 12 via the gate resistor 11, to the drain of the MOSFET 3 and the gate of the sense IGBT 4, as illustrated in FIG. 3. That is, the gate driver 12 functions as a drive voltage applying means, and the gate voltage VG becomes a drive voltage for the sense IGBT 4 and the main IGBT 5.

Further, a variable power supply voltage VCC is applied, from the power source 13, to each collector of the sense IGBT 4 and the main IGBT 5, and the emitter of the main IGBT 5 is set to a common potential. As the common potential, for example, the GND potential is taken into account.

The anode of diode 1 is connected to the emitter of the main IGBT 5, and the cathode of diode 1 is connected to the emitter of the sense IGBT 4. That is, the cathode of the diode 1 is arranged in the direction of the emitter of the sense IGBT 4.

The diode 1 is provided to prevent the current flowing through the sense IGBT 4 from flowing out to the common potential side. Providing the diode 1 allows the accumulation of an electric charge in the gate of the MOSFET 3, so that the potential between the gate and the source of the MOSFET 3 can be adjusted.

The drain of MOSFET 3 is connected to the gate of the sense IGBT 4, the source thereof is connected to the gate of main IGBT 5, and the gate thereof is connected to the emitter of the sense IGBT 4 and the cathode of diode 1.

Then, the MOSFET 3 receives the gate voltage VG at the drain thereof. The gate voltage VG is a drive voltage output from the gate driver 12 being a drive voltage applying means, via the gate resistor 11. The gate voltage VG is the drive voltage for the sense IGBT 4 and the main IGBT 5.

Further, one end of the resistor 2 constituting the charge discharge circuit is connected to the gate of the main IGBT 5 and the source of the MOSFET 3, and the other end of the resistor 2 is connected to the emitter of the main IGBT 5 and the anode of the diode 1.

The sense IGBT 4 and the main IGBT 5 constituting the semiconductor device S1 are manufactured by the same manufacturing method as the existing IGBT manufacturing method. As a document that discloses an existing manufacturing method of an IGBT, for example, the manufacturing method disclosed in Japanese patent gazette No. 4575713 is taken into account.

The diode 1, the resistor 2, and the MOSFET 3 being the other components of the semiconductor device S1, are selectively manufactured as described in (1) to (4) below, for example.

(1) In the diode region 94, the anode region 29 and the cathode region 30 are formed on the first main surface side in the base layer 40 by implanting boron and phosphorus into the region adjacent to each other on the first main surface side in the base layer 14, and then diffusing boron and phosphorus by high temperature heat treatment. As a result, the diode 1 is obtained in the diode region 94.

(2) In the resistor region 95, the polysilicon layer 64 having conductivity is formed by depositing the doped polysilicon on the interlayer insulating film 21. As a result, the resistor 2 is obtained from the polysilicon layer 64. Also, a method may also be adopted in which, after the polysilicon is deposited on the interlayer insulating film 21, boron or phosphorus is implanted to obtain the polysilicon layer 64 having conductivity.

(3) In the transistor region 96, boron is injected into the first main surface side in the drift layer 50 and diffused by high temperature heat treatment to form a p-type base layer 40, and then phosphorus is injected into the first main surface side in the base layer 40 and diffused by high temperature heat treatment to selectively form the drain region 41 and the source region 42.

(4) In the transistor region 96, the gate insulating film 46 is formed on the first main surface of the semiconductor substrate 100, and then the gate electrode 47 is formed on the gate insulating film 46. At this time, the gate insulating film 46 is formed from the drain region 41 to the source region 42. Therefore, the upper surface of the gate insulating film 46 serves as the forming surface of the gate electrode 47, and the lower surface of the gate insulating film 46 serves as the forming surface of the drain region 41 and the source region 42.

The drain electrode 48, the source electrode 49, and the anode electrode 58 are formed, for example, when the emitter electrode 20 and the emitter electrode 60 are manufactured.

Accordingly, in the semiconductor device S1 of Embodiment 1, the main IGBT 5, the sense IGBT 4, the MOSFET 3, the diode 1 and the resistor 2 which are the constituent elements are integrally provided on one semiconductor substrate 100. Therefore, the semiconductor device S1 can be downsized.

(Overcurrent State)

An overcurrent state in which an overcurrent flows through the semiconductor device S1 occurs due to an arm short circuit state or the like. In this case, it is assumed that a constant voltage is applied to the collector electrode 26 from the outside and a relatively high main gate voltage VM is applied to each of the plurality of gate electrodes 19. This main gate voltage VM becomes a first control voltage.

The ON operation during normal operation is performed as follows. First, an "H" level gate voltage VG is applied to the gate of the sense IGBT 4 as a drive voltage to turn ON the sense IGBT 4. Then, as a result of setting the gate voltage VE of the MOSFET 3 by the emitter voltage of the sense IGBT 4 in the ON state, the MOSFET 3 is turned ON. Subsequently, a gate current IG flows through the drain and the source of the MOSFET 3 in the ON state, and as a result of applying the main gate voltage VM to the gate of the main IGBT 5, the main IGBT 5 is in the ON state.

Further, the MOSFET 3 is turned ON because an electric charge is accumulated at the gate of the MOSFET 3 by the diode 1 and the voltage between the gate and the source of the MOSFET 3 exceeds the threshold voltage.

In the semiconductor device S1 of Embodiment 1, when an overcurrent is flowing through the main IGBT 5 being the first power switching element, the main gate voltage VM serves as a first control voltage applied to the gate of the main IGBT 5 is higher than usual.

Therefore, when an overcurrent flows through the main IGBT 5, the potential difference between the gate and the source of the MOSFET 3 being a first MOSFET, inclines to become smaller, and the ON state of MOSFET 3 is weaken. This is because the main gate voltage VM being the source voltage of MOSFET 3, rises. The MOSFET 3 may be turned OFF.

As the ON state of MOSFET 3 becomes weaker, the excess charge accumulated at the gate of the main IGBT 5 is discharged to the outside of the emitter side of the main IGBT 5 via the resistor 2 per se being the charge discharge path.

As a result, the semiconductor device S1 of Embodiment 1 ensures the reduction in the amount of current flowing through the main IGBT 5 by lowering the main gate voltage VM swiftly, being the first control voltage in the overcurrent state.

(Application of Negative Gate Voltage VG)

Next, consider the case where a negative gate voltage VG is applied from the gate driver 12 as the drive voltage.

When the negative gate voltage VG is applied, a phenomenon is assumed in which, even if the MOSFET 3 is in the OFF state, a reverse current flows from the emitter of the main IGBT 5 to the gate driver 12 through the parasitic diode in the MOSFET 3.

In the semiconductor device S1 of Embodiment 1, the resistor 2 that forms a charge discharge circuit and serves as a charge discharge path per se is interposed between the source of the MOSFET 3 and the emitter of the main IGBT 5. Therefore, even if the gate voltage VG becomes a negative level, the source potential of the MOSFET 3 can be changed to approach the negative gate voltage VG due to the voltage drop by the resistor 2. That is, the current flowing through the resistor 2 is a rate-controlling factor for the reverse current.

As described above, the semiconductor device S1 of Embodiment 1 has the resistor 2 that serves as a charge discharge path from the gate to the emitter of the main IGBT 5. The resistor 2 serves as the charge discharge circuit, and the above charge discharge path is present between the source of the MOSFET 3 and the emitter of the main IGBT 5.

Therefore, in the semiconductor device S1 of Embodiment 1, even if the gate voltage VG becomes a negative level, the presence of the resistor 2 reduces the potential difference between the drain and the source of the MOSFET 3, so that the phenomenon of the reverse current flowing through the parasitic diode in the MOSFET 3 is suppressed.

Therefore, in the semiconductor device S1, even when a negative gate voltage VG is applied, a non-negligible amount of reverse current does not flow, and the gate driver 12 serving as a driving voltage applying means and the gate resistor 11 serving as an external resistor are not adversely affected.

Embodiment 2

Figure 4:
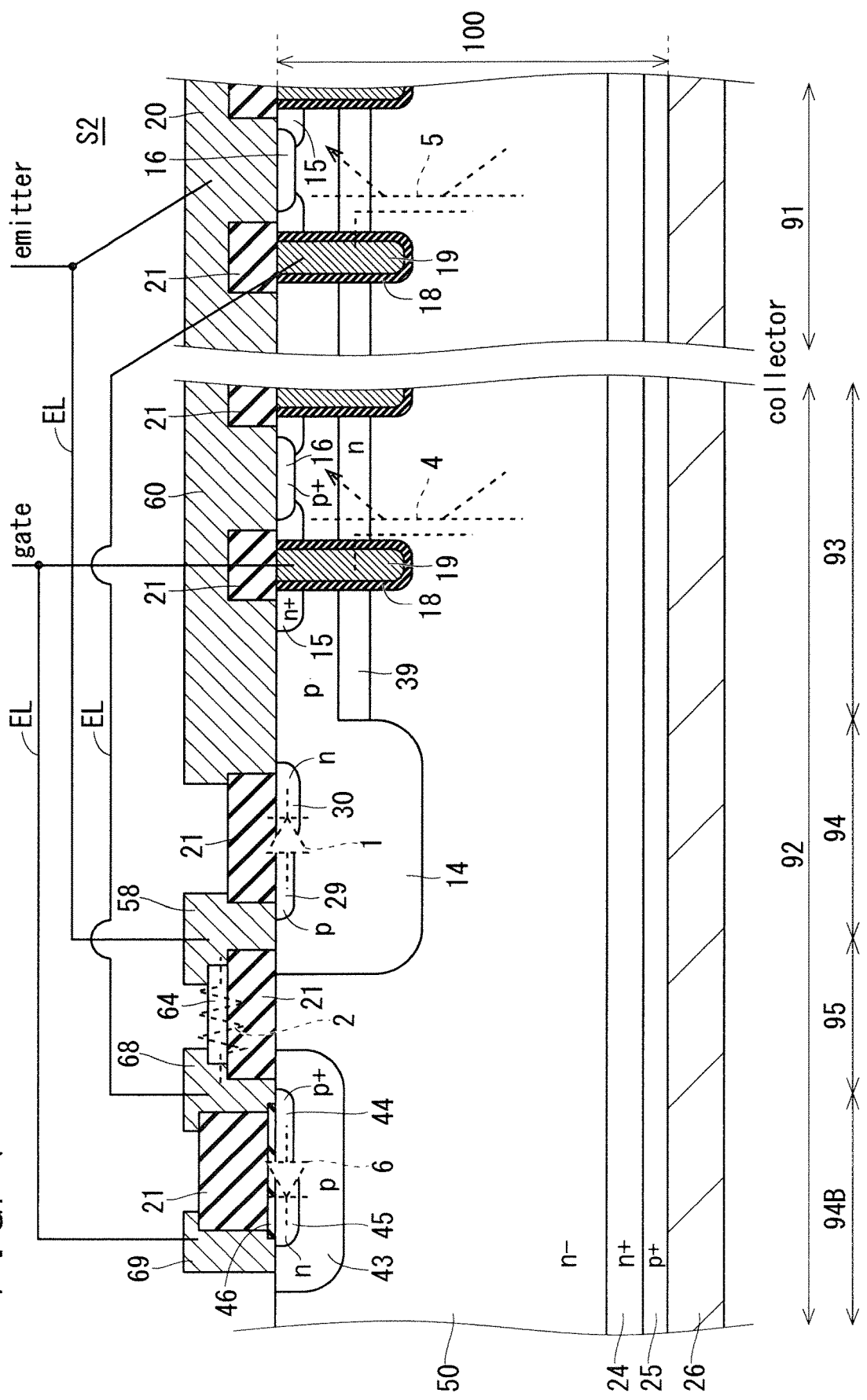
FIG. 4 is a cross-sectional view illustrating a cross-sectional structure of a semiconductor device according to Embodiment 2.
Figure 5:
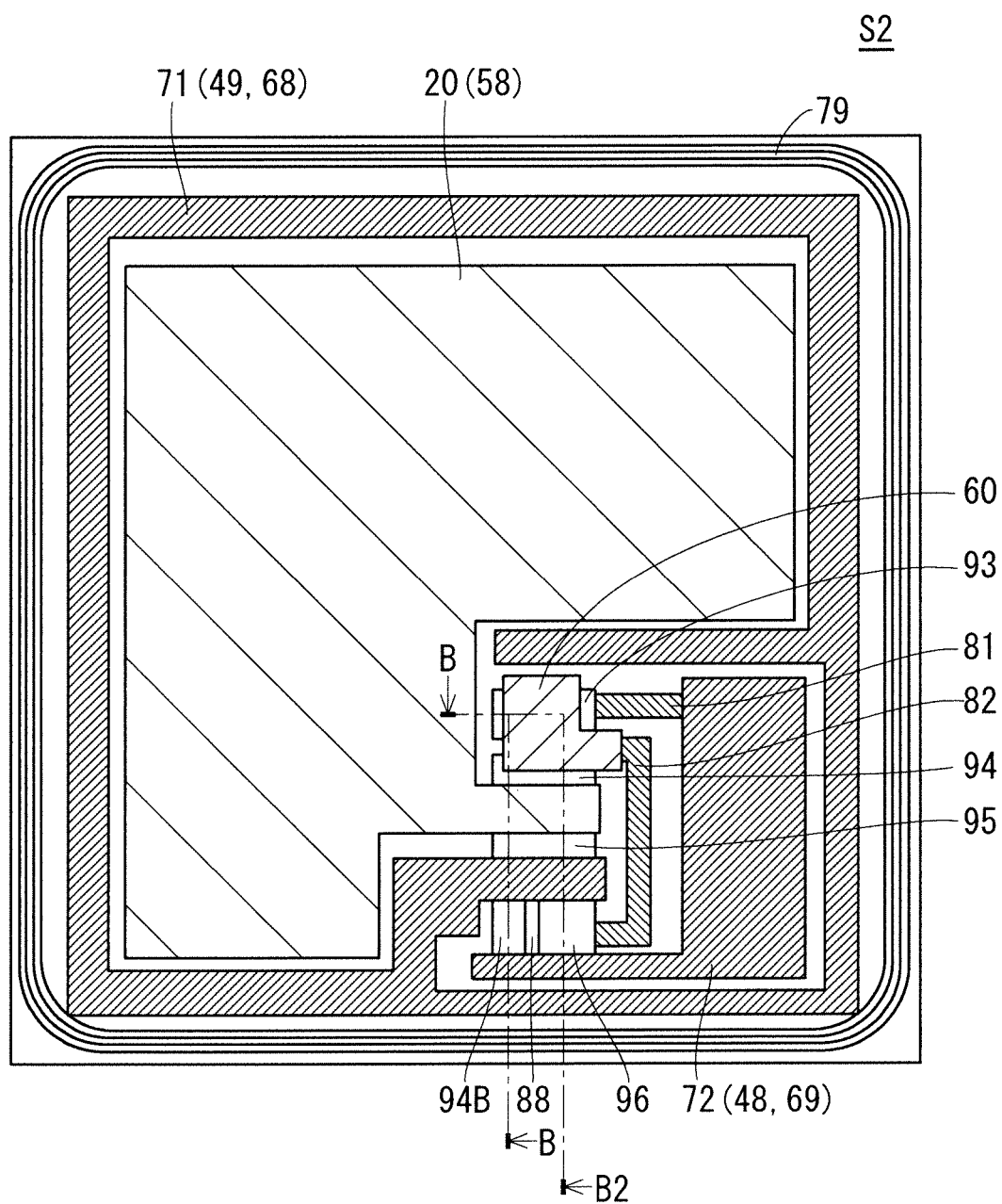
FIG. 5 is a plan view illustrating a plan structure of the semiconductor device according to Embodiment 2.

FIG. 4 is a cross-sectional view illustrating a cross-sectional structure of a semiconductor device S2 according to Embodiment 2. FIG. 5 is a plan view illustrating a plan structure of the semiconductor device of according to Embodiment 2. The cross-section B-B of FIG. 5 is illustrated in FIG. 4. Further, the cross section of B-B2 in FIG. 5 is the same as the cross section structure of Embodiment 1 illustrated in FIG. 1. In FIG. 5, for convenience of explanation, an interlayer insulating film 21, a gate electrode 47, and a polysilicon layer 64 are omitted.

The semiconductor substrate 100 of the semiconductor device S2 is classified into a main region 91 and an auxiliary region 92, and the auxiliary region 92 is further classified into a sense region 93, a diode region 94, a resistor region 95, a transistor region 96, and a diode region 94B.

Hereinafter, the same reference numerals are assigned for the same structure as that of the semiconductor device S1, and the description thereof will be appropriately omitted, and the diode region 94B, which is a characteristic portion of the semiconductor device S2 of Embodiment 2, will be described.

A base layer 43 is provided on the first main surface side in the drift layer 50. The impurity concentration of the base layer 43 exhibits a p-type.

In the diode region 94, a p-type anode region 44 and an n-type cathode region 45 are provided adjacent to each other on the first main surface side in the base layer 43.

A diode 6 being a second diode is configured with the above-mentioned anode region 44 and cathode region 45 as the main components.

Then, in addition to the drain electrode 48, the source electrode 49, the anode electrode 58, the emitter electrode 60 and the emitter electrode 20, an anode electrode 68 and a cathode electrode 69 are provided on the first main surface of the semiconductor substrate 100.

The anode electrode 68 is provided from one end portion of the polysilicon layer 64 over a part of the base layer 43 to a part of the anode region 44. Therefore, the anode electrode 68 is electrically connected to the anode region 44 and the polysilicon layer 64.

The cathode electrode 69 is provided from a part of the base layer 43 to a part of the cathode region 45. Therefore, the cathode electrode 69 is electrically connected to the cathode region 45.

As illustrated in FIG. 4, the semiconductor device S2 has an electrical connection relationship indicated by electrical connection lines EL among the cathode electrode 69, the anode electrode 68, the anode electrode 58, the emitter electrode 60, the emitter electrode 20, the gate electrode 19 in the sense region 93, and the gate electrode 19 in the main region 91. Aluminum is used as a constituent material of the above-mentioned electrodes, for example.

As illustrated in FIG. 4, the cathode electrode 69 and the gate electrode 19 in the sense region 93 are electrically connected. The anode electrode 68 and the gate electrode 19 of the main region 91 are electrically connected. The anode electrode 58 and the emitter electrode 20 are electrically connected.

Although not illustrated in FIG. 4, in the semiconductor device S2 of Embodiment 2, the drain electrode 48 and the gate electrode 19 in the sense region 93 are electrically connected therebetween, the gate electrode 47 and the emitter electrode 60 are electrically connected therebetween, and the source electrode 49 and the gate electrode 19 in the main region 91 are electrically connected therebetween, as in Embodiment 1, as illustrated in FIG. 1.

As illustrated in FIG. 5, an isolation region 88 is provided between the transistor region 96 and the diode region 94B. The isolation region 88 is provided deeper than the formation depth of the base layer 40 and the base layer 43 from the first main surface toward the second main surface of the semiconductor substrate 100. The isolation region 88 separates the base layer 40 of the transistor region 96 and the base layer 43 of the diode region 94B. The material of the isolation region 88 is not particularly limited as long as the base layer 40 and the base layer 43 can be electrically separated from each other. For example, the isolation region 88 may be formed by a trench in which nothing is provided.

By providing the isolation region 88 in this manner, the MOSFET 3 formed in the transistor region 96 and the diode 6 formed in the diode region 94B are not affected by each other. An oxide film or the like may be provided on the isolation region 88 as a protective film.

As illustrated in FIG. 5, most of the gate pulling up portion 71 is provided along the outer circumference of the emitter electrode 20, and a part of the gate pulling up portion 71 is provided so as to extend over the resistor region 95, the transistor region 96, and the diode region 94B. As a result, the gate pulling up portion 71 also functions as the source electrode 49 and the anode electrode 68 illustrated in FIG. 4.

Further, in terms of a gate pad 72, a part thereof is formed so as to extend over the transistor region 96 and the diode region 94B, thereby also functioning as the drain electrode 48 illustrated in FIG. 1 and the cathode electrode 69 illustrated in FIG. 4.

The other planar structures in FIG. 5 are the same as the planar structures illustrated in FIG. 2; therefore, they are assigned with the same reference numerals, and the description thereof will be omitted as appropriate.

The diode 6 being a component of the semiconductor device S2, can be manufactured by the same manufacturing method as that of the diode 1.

Accordingly, in the semiconductor device S2 of Embodiment 2, the main IGBT 5, the sense IGBT 4, the MOSFET 3, the diode 1, the diode 6 and the resistor 2 which are the constituent elements are integrally provided on one semiconductor substrate 100. Therefore, the semiconductor device S2 can be downsized.

Figure 6:
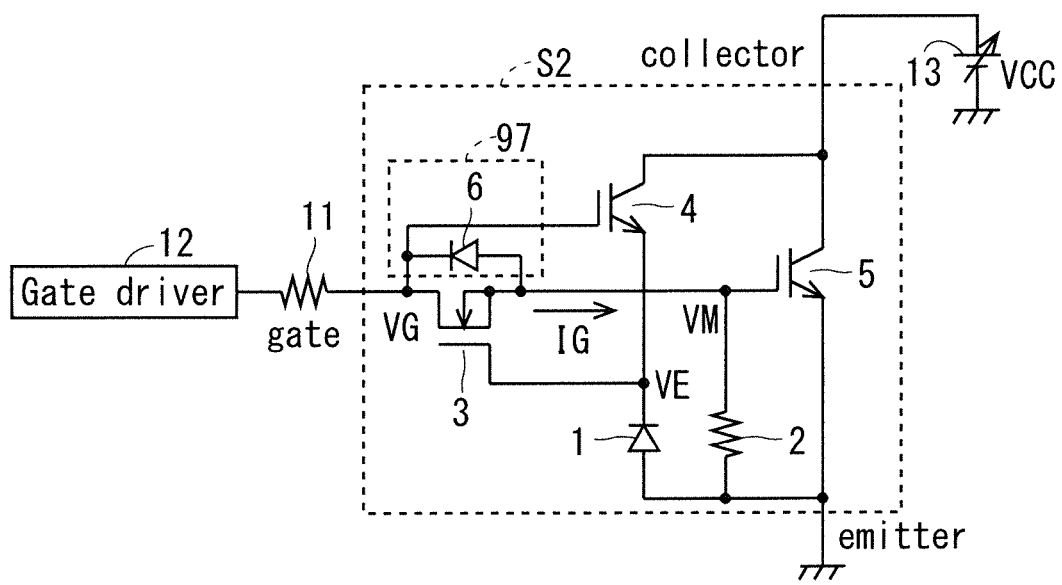
FIG. 6 is a circuit diagram illustrating a circuit configuration of the semiconductor device according to Embodiment 2.

FIG. 6 is a circuit diagram illustrating a circuit configuration of the semiconductor device S2 illustrated in FIGS. 4 and 5. Hereinafter, the same components as those of the semiconductor device S1 are assigned with the same reference numerals and the description thereof will be omitted, and the circuit configuration of the semiconductor device S2 will be described with reference to FIG. 6.

The semiconductor device S2 includes, as the main components, the main IGBT 5 being a first power switching element, the sense IGBT 4 being a second power switching element, the resistor 2 being a first resistor, the n-type MOSFET 3 being a first MOSFET, the diode 1 being a first diode, and the diode 6 being a second diode.

Regarding the diode 6 illustrated in FIG. 6, the anode thereof corresponds to the anode electrode 68 illustrated in FIGS. 4 and 5, and the cathode thereof corresponds to the cathode electrode 69 illustrated in FIGS. 4 and 5.

The anode of the diode 6 is connected to the source of the MOSFET 3, the gate of the main IGBT 5 and one end of the resistor 2, and the cathode of the diode 6 is connected to the drain of the MOSFET 3 and the gate of the sense IGBT 4.

(Overcurrent State)

The semiconductor device S2 of Embodiment 2 ensures the reduction in the amount of current flowing through the main IGBT 5 by lowering the main gate voltage VM swiftly, being the first control voltage in the overcurrent state, as in the semiconductor device S1 of Embodiment 1.

(Turn-Off Operation)

The semiconductor device S2 of Embodiment 2 further includes the diode 6 being the second diode. Accordingly, when the gate voltage VG is set to 0 V or less and the main IGBT 5 is turned OFF when the main IGBT 5 is in the On state, the electric charge applied to the gate of the main IGBT 5 is swiftly extracted to the outside of the gate driver 12 side via the diode 6.

That is, the diode 6 secures a charge extraction path for extracting the charge applied to the gate of the main IGBT 5 at the time of turn-Off, in addition to the resistor 2 being the charge discharge path per se.

Therefore, in the semiconductor device S2 of Embodiment 2, even if the resistor value of the resistor 2 is set sufficiently large, the turn-Off operation is not hindered.

As described above, in the semiconductor device S2 of Embodiment 2, the acceleration of the turn-Off operation is ensured by providing the diode 6.

(Application of Negative Gate Voltage VG)

Next, consider the case where a negative gate voltage VG is applied from the gate driver 12.

As described above, in the semiconductor device S2, the resistor value of the resistor 2 can be set substantially large.

Therefore, the resistor 2 is interposed between the source of the MOSFET 3 and the emitter of the main IGBT 5, and the resistor value of the resistor 2 can be set sufficiently large. Accordingly, even if the gate voltage VG becomes a negative level, the source potential of the MOSFET 3 can be set to the same level as the gate voltage VG by due to the voltage drop by the resistor 2. Therefore, almost no reverse current flows through the parasitic diode of the MOSFET 3 or the diode 6.

As a result, the semiconductor device S2 of Embodiment 2 minimizes the reverse current flowing through the parasitic diode of the MOSFET 3 or the diode 6 even if the gate voltage VG becomes a negative level.

Embodiment 3

Figure 7:
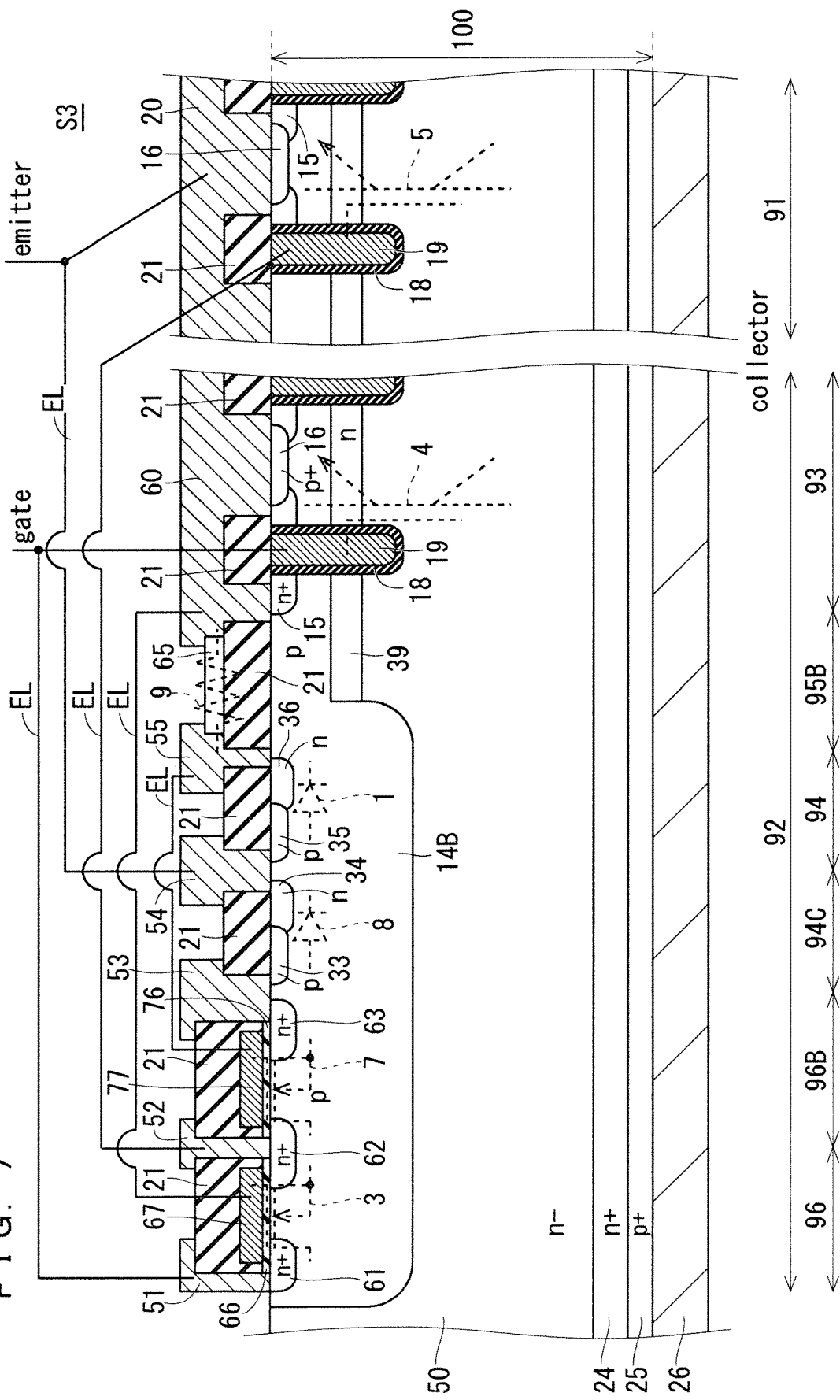
FIG. 7 is a cross-sectional view illustrating a cross-sectional structure of a semiconductor device according to Embodiment 3.
Figure 8:
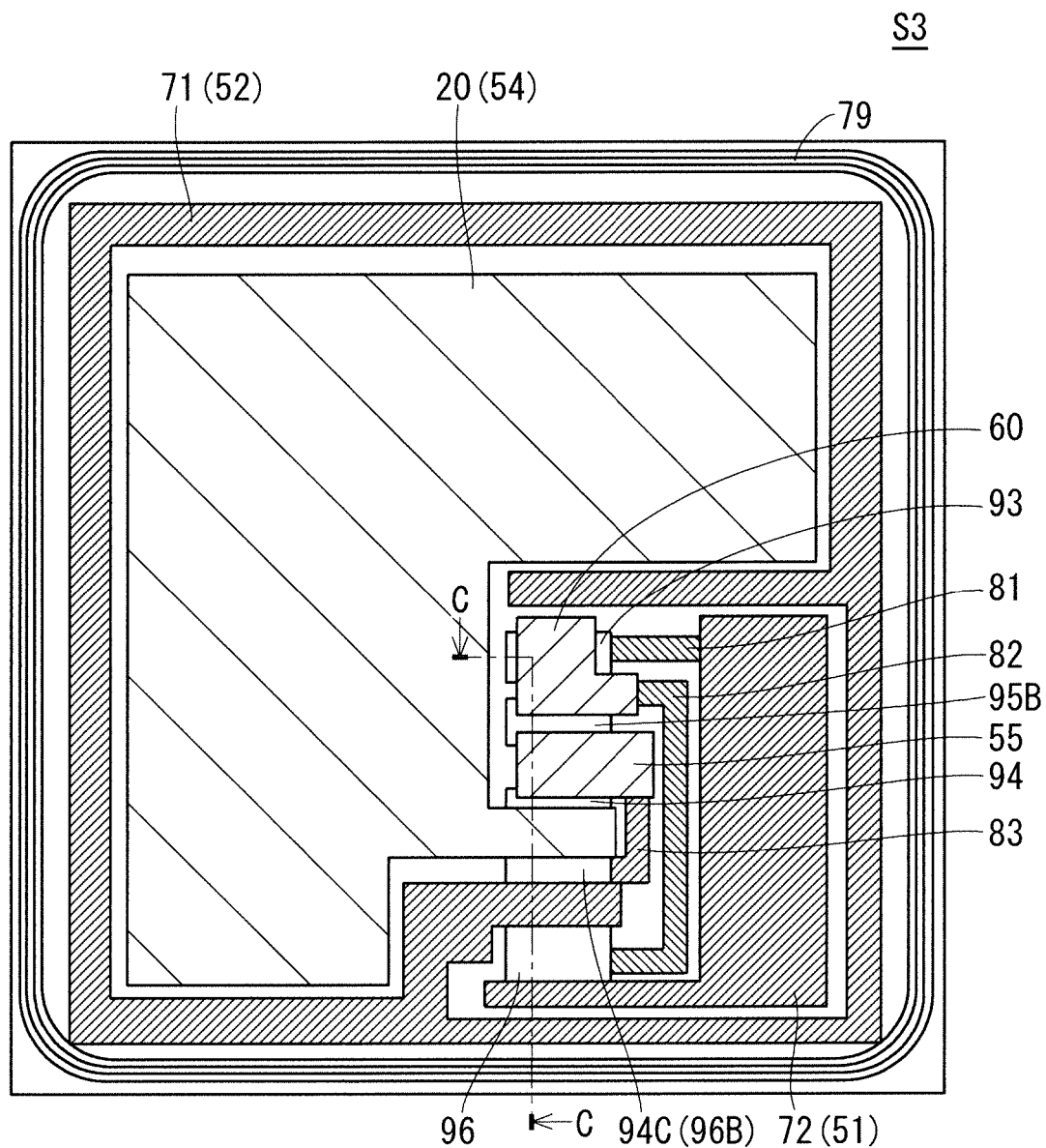
FIG. 8 is a plan view illustrating a plan structure of the semiconductor device according to Embodiment 3.

FIG. 7 is a cross-sectional view illustrating a cross-sectional structure of a semiconductor device S3 according to Embodiment 3. FIG. 8 is a plan view illustrating a plan structure of the semiconductor device of according to Embodiment 3. The cross-section C-C of FIG. 8 is illustrated in FIG. 7. In FIG. 8, for convenience of explanation, the interlayer insulating film 21, a source/anode electrode 53, a gate electrode 67, a gate electrode 77, and a polysilicon layer 65 are omitted.

As illustrated in FIG. 7, the semiconductor substrate 100 of the semiconductor device S3 is classified into a main region 91 and an auxiliary region 92, and the auxiliary region 92 is further classified into a sense region 93, a resistance region 95B, a diode region 94, a diode region 94C, a transistor region 96B, and a transistor region 96.

Hereinafter, the main region 91 and the sense region 93 of the auxiliary region 92 has the same structure as those of the semiconductor device S1; therefore, the description thereof will be omitted as appropriate by assigning the same reference numerals, and the features of the semiconductor device S3 of Embodiment 3 will be mainly described.

A base layer 14B is provided on the first main surface side in the drift layer 50. The base layer 14B exhibits a p-type. The base layer 14B is provided from the auxiliary region 92 over the main region 91. The base layer 14B is provided so that the formation depth of the region thereof from the transistor region 96 to a part of the resistor region 95B is deeper than the formation depth of the region thereof from the sense region 93 to the main region 91.

In the transistor region 96, a drain region 61 and a source/drain region 62 are selectively provided on the first main surface side in the base layer 14B. The drain region 61 and the source/drain region 62 exhibit an $n^+$ type having a relatively high impurity concentration of the n-type. A gate electrode 67 is provided on the first main surface of the base layer 14B between the drain region 61 and the source/drain region 62 via a gate insulating film 66.

In the transistor region 96B, and the source/drain region 62 and the source region 63 are selectively provided on the first main surface side within the base layer 14B. The source region 63 exhibits an $n^+$ type having a relatively high impurity concentration of the n-type. A gate electrode 77 is provided on the first main surface of the base layer 14B between the source/drain region 62 and the source region 63. The source region 63 exhibits an $n^+$ type having a relatively high impurity concentration of the n-type.

The n-channel type MOSFET 3, being a first MOSFET, is configured with the above-mentioned base layer 14B, the drain region 61, the source/drain region 62, the gate insulating film 66, and the gate electrode 67 as main components. The source/drain region 62 functions as the source region of the MOSFET 3.

The n-channel type MOSFET 3, being a second MOSFET, is configured with the above-mentioned base layer 14B, the source/drain region 62, the source region 63, a gate insulating film 76, and a gate electrode 77 as main components. The source/drain region 62 functions as a drain region of a MOSFET 7.

In the diode region 94, a p-type anode region 29 and an n-type cathode region 30 are provided adjacent to each other on the first main surface side in the base layer 14.

A diode 8 being a second diode is configured with the above-mentioned anode region 33 and cathode region 34 as the main components.

In the diode region 94, a p-type anode region 35 and an n-type cathode region 30 are provided adjacent to each other on the first main surface side in the base layer 14B.

A diode 6 being a first diode is configured with the above-mentioned anode region 35 and cathode region 36 as the main components.

Similar to the semiconductor devices S1 and S2, the sense IGBT 4 and the main IGBT 5 are provided in the main region 91 and the sense region 93 of the auxiliary region 92 of the semiconductor device S3. However, the semiconductor device S3 of Embodiment 3 is different from the semiconductor devices S1 and S2 in that the base layer 14 is replaced with the base layer 14B.

In the transistor region 96, the interlayer insulating film 21 is provided so as to cover the gate electrode 67. In the transistor region 96B, the interlayer insulating film 21 is provided so as to cover the gate electrode 77.

In the diode region 94C, the interlayer insulating film 21 is provided on the first main surface of the anode region 33 and the cathode region 34. In the diode region 94, the interlayer insulating film 21 is provided on the first main surface of the anode region 35 and the cathode region 36.

In the resistance region 95B, the interlayer insulating film 21 is provided on the first main surface of the base layer 14B.

In the resistance region 95B, a polysilicon layer 65 having conductivity is provided on the interlayer insulating film 21. The polysilicon layer 65 functions as a resistor 9.

Then, a drain electrode 51, a source/drain electrode 52, a source/anode electrode 53, a cathode/anode electrode 54, a cathode electrode 55, an emitter electrode 60 and an emitter electrode 20 are provided on the first main surface of the semiconductor substrate 100.

The drain electrode 51 is provided on a part of the drain region 61, and the source/drain electrode 52 is provided on a part of the source/drain region 62. Therefore, the drain electrode 51 is electrically connected to the drain region 61, and the source/drain electrode 52 is electrically connected to the source/drain region 62.

The source/anode electrode 53 is provided from a part of the source region 63 over a part of the base layer 14B to a part of the anode region 33. Therefore, the source/anode electrode 53 is electrically connected to the source region 63 and the anode region 33.

The cathode/anode electrode 54 is provided from a part of the cathode region 34 over a part of the base layer 14B to a part of the anode region 35. Therefore, the cathode/anode electrode 54 is electrically connected to the cathode region 34 and the anode region 35.

The cathode electrode 55 is provided from a part of the cathode region 36 over a part of the base layer 14B to a part of the polysilicon layer 65. Therefore, the cathode electrode 55 is electrically connected to the cathode region 36 and the polysilicon layer 65.

The emitter electrode 60 is provided from the other end of the polysilicon layer 65 over the entire region of the sense region 93. Therefore, the emitter electrode 60 is electrically connected to the polysilicon layer 65, the $n^+$ source region 15 and the $p^+$ diffusion region 16 in the sense region 93.

The emitter electrode 20 is provided in the entire region of the main region 91. Therefore, the emitter electrode 20 is electrically connected to the $n^+$ source region 15 and the $p^+$ diffusion region 16 in the main region 91.

As illustrated in FIG. 7, the semiconductor device S3 has an electrical connection relationship indicated by electrical connection lines EL among the drain electrode 51, the gate electrode 67, the source/drain electrode 52, the gate electrode 77, the cathode/anode electrode 55, the emitter electrode 60, the emitter electrode 20, the gate electrode 19 in the sense region 93, and the gate electrode 19 in the main region 91. Aluminum is used as a constituent material of the above-mentioned electrodes, for example.

As illustrated in FIG. 7, the drain electrode 51 and the gate electrode 19 in the sense region 93 are electrically connected, the gate electrode 67 and the emitter electrode 60 are electrically connected, and the source/drain electrode 52 and the gate electrode 19 in the main region 91 are electrically connected.

Also the gate electrode 77 and the cathode electrode 55 are electrically connected and the cathode/anode electrode 54 and the emitter electrode 20 are electrically connected.

As illustrated in FIG. 8, a part of the emitter electrode 20 extends over the diode region 94 and the diode region 94C, thereby also serving as a function of the cathode/anode electrode 54 illustrated in FIG. 7. That is, the emitter electrode 20 and the cathode/anode electrode 54 are integrally provided.

Further, although most of a gate pulling up portion 71 is provided along the outer circumference of the emitter electrode 20, a part of the gate pulling up portion 71 extends above between the resistance region 96 and the transistor region 96B, thereby also functioning as the source/drain electrode 52 illustrated in FIG. 7. The gate pulling up portion 71 is electrically connected to the plurality of gate electrodes 19 in the main region 91.

Further, a gate pad 72 is formed such that a part thereof extends over the transistor region 96, thereby also functioning as the drain electrode 51 illustrated in FIG. 7.

Further, as illustrated in FIG. 8, by providing a wiring layer 81 between the sense region 93 and the gate pad 72, the gate pad 72 and the gate electrode 19 of the sense region 93 are electrically connected via the wiring layer 81.

Further, a wiring layer 82 is provided between the emitter electrode 60 and the transistor region 96. Therefore, the emitter electrode 60 in the sense region 93 and the gate electrode 67 in the transistor region 96 are electrically connected via the wiring layer 82.

Further, a wiring layer 83 is provided between the cathode electrode 55 and the transistor region 96B. Therefore, the cathode electrode 55 and the gate electrode 77 in the transistor region 96B are electrically connected via the wiring layer 83.

The diode 1 and the diode 6 of the semiconductor device S3 can be manufactured by the same manufacturing method as that of the diode 1 of the semiconductor device S1. The MOSFET 3 and the MOSFET 7 of the semiconductor device S3 can be manufactured by the same manufacturing method as that of the MOSFET 3 of the semiconductor device S1. The resistor 9 of the semiconductor device S3 can be manufactured by the same manufacturing method as that of the resistor 2 of the semiconductor device S1.

Accordingly, in the semiconductor device S3 of Embodiment 3, the main IGBT 5, the sense IGBT 4, the MOSFET 3, the diode 1, the MOSFET 7, the diode 8 and the resistor 9 which are the constituent elements are integrally provided on one semiconductor substrate 100. Therefore, the semiconductor device S3 can be downsized.

Figure 9:
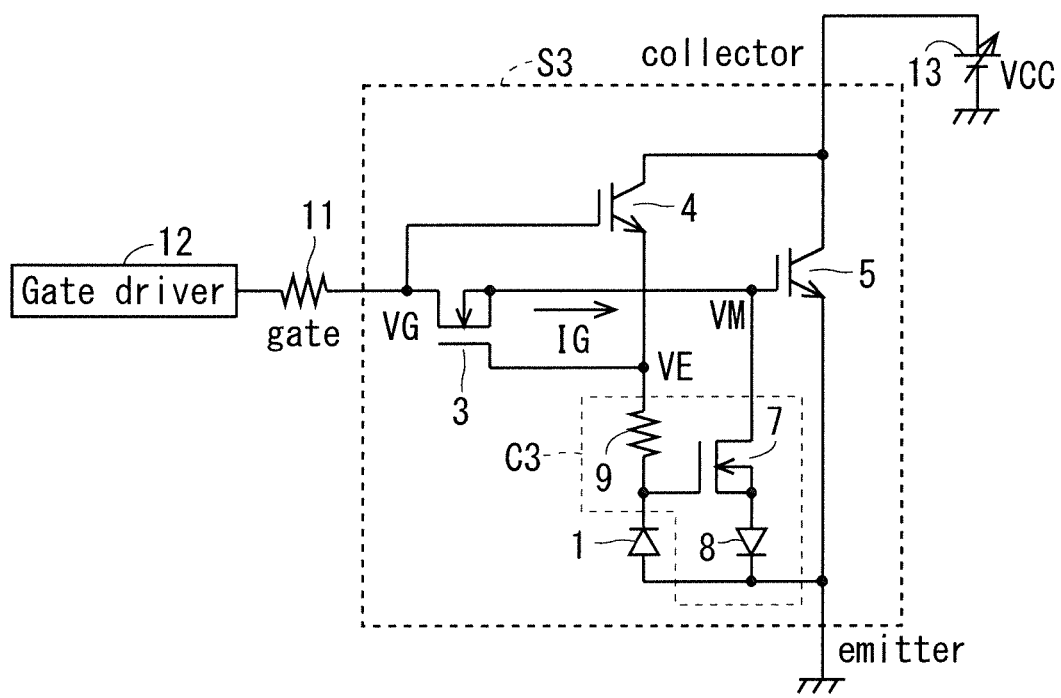
FIG. 9 is a circuit diagram illustrating a circuit configuration of the semiconductor device according to Embodiment 3.

FIG. 9 is a circuit diagram illustrating a circuit configuration of the semiconductor device S3 illustrated in FIGS. 7 and 8. Hereinafter, the same components as those of the semiconductor device S1 are assigned with the same reference numerals and the description thereof will be omitted, and the circuit configuration of the semiconductor device S3 will be described with reference to FIG. 9.

The semiconductor device S3 includes, as the main components, the main IGBT 5 being a first power switching element, the sense IGBT 4 being a second power switching element, the n-type MOSFET 3 being a first MOSFET, the diode 1 being a first diode, the n-type MOSFET 7 being a second MOSFET and the diode 8 being a third diode.

Hereinafter, regarding the semiconductor device S3 of Embodiment 3, the correspondence of electrodes between the device structure illustrated in FIGS. 7 and 9 and the circuit configuration illustrated in FIG. 9 will be described.

For MOSFET 3, the drain corresponds to the drain electrode 51, the gate corresponds to the gate electrode 67, and the source corresponds to the source/drain electrode 52.

The MOSFET 7 has a drain as one electrode, a source as an other electrode, and a gate as a control electrode. For MOSFET 7, the drain corresponds to the source/drain electrode 52, the gate corresponds to the gate electrode 77, and the source corresponds to the source/anode electrode 53.

For diode 1, the anode corresponds to the cathode/anode electrode 54 and the cathode corresponds to the cathode electrode 55. For diode 8, the anode corresponds to the source/anode electrode 53 and the cathode corresponds to the cathode/anode electrode 54.

As illustrated in FIG. 9, the drain of the MOSFET 7, being the second MOSFET, is connected to the gate of the main IGBT 5.

The anode of diode 8, being the third diode, is connected to the source of the MOSFET 7, and the cathode of diode 8 is connected to the emitter of the main IGBT 5 and the anode of diode 1.

One end of the resistor 9, being the second resistor, is connected to the emitter of the sense IGBT 4 and the gate of the MOSFET 3, and the other end of the resistor 9 is connected to the gate of the MOSFET 7 and the cathode of the diode 1. That is, the cathode of the diode 1, being the first diode, is arranged in the direction of the emitter of the sense IGBT 4.

The diode 8 is provided for the purpose of suppressing the reverse current from flowing from the emitter of the main IGBT 5 toward the gate via the parasitic diode of the MOSFET 7.

In the semiconductor device S3, a charge discharge circuit C3 is constituted by the above-mentioned MOSFET 7, the diode 8 and the resistor 9. And, the MOSFET 7 and the diode 8 serve as the charge discharge path provided from the gate to the emitter of the main IGBT 5. The charge discharge path becomes conductive when the MOSFET 7 is in the On state, and the charge accumulated in the gate of the main IGBT 5 can be discharged via the charge discharge path.

(Overcurrent State)

In the semiconductor device S3 of Embodiment 3, when an overcurrent is flowing through the main IGBT 5 being the first power switching element, the main gate voltage VM serves as a first control voltage applied to the gate of the main IGBT 5 is high.

Therefore, when an overcurrent flows through the main IGBT 5, the potential difference between the gate and the source of the MOSFET 3 being a first MOSFET, inclines to become smaller, and the ON state of MOSFET 3 is weaken. The MOSFET 3 may be turned OFF.

At the same time, since an overcurrent is flowing through the sense IGBT 4, the gate potential of the MOSFET 7, being a second MOSFET, exceeds the threshold voltage and is turned ON. Therefore, when an overcurrent flows through the main IGBT 5, the On-state MOSFET 7 and the diode 8 form a charge discharge path that is in a conductive state.

Accordingly, as the ON state of MOSFET 3 becomes weaker, the excess charge accumulated at the gate of the main IGBT 5 is discharged to the outside of the emitter side of the main IGBT 5 via the charge discharge path in the charge discharge circuit C3.

As a result, the semiconductor device S3 of Embodiment 3 ensures the reduction in the amount of current flowing through the main IGBT 5 by lowering the main gate voltage VM swiftly, during the overcurrent state.

(Turn-Off Operation)

In the semiconductor device S3, the charge discharge circuit C3 is constituted by the MOSFET 7, the diode 8 and the resistor 9.

In the state immediately before the turn-Off, both the sense IGBT 4 and the main IGBT 5 are in the ON state. Therefore, the source potential of the MOSFET 3 is a relatively high potential of "H" level due to the main gate voltage VM. ON the other hand, the source potential of MOSFET 7 is close to the common potential of "L" level, which is a relatively low potential.

Therefore, by appropriately setting the resistor value of the resistor 9, it is designed the MOSFET 7 to be in the ON state even if the MOSFET 3 is in the OFF state during the turn-Off period. That is, by appropriately setting the resistor value of the resistor 9, the charge discharge path by the MOSFET 7 and the diode 8 in the ON state is formed during the turn-Off operation.

Therefore, when the gate voltage VG is set to 0 V or less and the main IGBT 5 is turned OFF when the main IGBT 5 is in the ON state, it is quickly pulled out to the outside of the emitter side of the main IGBT 5 via the above charge discharge path in the charge discharge circuit C3.

That is, the MOSFET 7 and the diode 8 in the charge discharge circuit C3 secure a charge extraction path for extracting the charge applied to the gate of the main IGBT 5 at the time of turn-Off.

As described above, in the semiconductor device S3 of Embodiment 3, the acceleration of the turn-Off operation is ensured by the charge discharge circuit C3.

(Application of Negative Gate Voltage VG)

Next, consider the case where a negative gate voltage VG is applied from the gate driver 12 as the drive voltage.

When the negative gate voltage VG is applied, a phenomenon is assumed in which, even if the MOSFET 3 and the MOSFET 7 are in the Off state, a reverse current flows from the emitter of the main IGBT 5 to the gate driver 12 through the parasitic diode in the MOSFET 3 and the parasitic diode in the MOSFET 7.

In the semiconductor device S3, the MOSFET 7 being the second MOSFET and the diode 8 being the third diode are interposed between the source of the MOSFET 3 and the emitter of the main IGBT 5.

As described above, the charge discharge circuit C3 of the semiconductor device S3 has the charge discharge path constituted by the MOSFET 7 and the diode 8 from the gate to the emitter of the main IGBT 5. That is, the charge discharge path is present between the source of the MOSFET 3 and the emitter of the main IGBT 5.

Therefore, in the semiconductor device S3 of Embodiment 3, when the gate voltage VG becomes a negative level, the current path for the reverse current flowing from the emitter of the main IGBT 5 to the gate driver 12 goes from the diode 8, the MOSFET 7, the MOSFET 3, and the gate resistor 11.

As a result, the semiconductor device S3 of Embodiment 3 ensures the effective suppression of the reverse current because the reverse current is rate-controlled to the leakage current of the diode 8, that is, the amount of the reverse current is suppressed to a minute leakage current flowing through the diode 8.

Others

In above-described Embodiments, although an n-channel type IGBT is illustrated as an n-channel type power switching element, other power switching elements such as an n-channel type power MOSFET are adoptable.

In above-described Embodiments, although the sense IGBT 4 and the main IGBT 5 having the trench type gate electrodes 19 are illustrated, the structure is not limited thereto, and for example, the sense IGBT 4 and the main IGBT 5 having the planar type gate electrodes may also be adopted.

In above-described Embodiments, although planar type MOSFETs 3 and 7 are illustrated, the structure is not limited thereto, and for example, the MOSFETs 3 and 7 having a trench type gate electrode may also be adopted.

Needless to say, the structures of the resistors 2 and 9 and the diodes 1, 6 and 8 are not limited to the structures illustrated in Embodiments 1 to 3.

In the present disclosure, Embodiments can be arbitrarily combined, appropriately modified or omitted, without departing from the scope of the invention.

While the invention has been illustrated and described in detail, the foregoing description is in all aspects illustrative and not restrictive. It is therefore understood that numerous modifications and variations can be devised without departing from the scope of the invention.

What is claimed is:

1. A semiconductor device comprising:
   a first power switching element of an n-channel type having one electrode, an other electrode and a control electrode;
   a second power switching element of the n-channel type having one electrode, an other electrode and a control electrode in which the one electrode thereof is connected to the one electrode of the first power switching element;
   a first diode in which an anode thereof is connected to the other electrode of the first power switching element, and a cathode thereof is arranged in a direction toward the other electrode of the second power switching element;
   a first MOSFET of the n-channel type, having one electrode, an other electrode and a control electrode, in which the one electrode thereof receives a drive voltage for the first power switching element and the second power switching element, the one electrode thereof is connected to the control electrode of the second power switching element, the other electrode thereof is connected to the control electrode of the first power switching element, and the control electrode thereof is connected to the other electrode of the second power switching element; and
   a charge discharge circuit provided from the control electrode of the first power switching element to the other electrode of the first power switching element and having a charge discharge path.

2. The semiconductor device according to claim 1, wherein,
   the cathode of the first diode is connected to the other electrode of the second power switching element, and
   the charge discharge circuit is a first resistor, one end thereof is connected to the control electrode of the first power switching element, and an other end is connected to the other electrode of the first power switching element.

3. The semiconductor device according to claim 2, further comprising
   a second diode in which an anode thereof is connected to the other electrode of the first MOSFET, and a cathode thereof is connected to the one electrode of the first MOSFET.

4. The semiconductor device according to claim 1, wherein
   the charge discharge circuit includes
      a second MOSFET of the n-channel type, having one electrode, an other electrode and a control electrode, in which the one electrode thereof is connected to the control electrode of the first power switching element, the other electrode thereof is connected to the cathode of the first diode,
      a third diode in which an anode thereof is connected to the other electrode of the second MOSFET, and a cathode thereof is connected to the other electrode of the first power switching element, and
      a second resistor in which one end thereof is connected to the other electrode of the second power switching element and the control electrode of the first MOSFET, and an other end is connected to the control electrode of the second MOSFET and the cathode of the first diode.

5. The semiconductor device according to claim 1, wherein
   the first power switching element, the second power switching element, the first diode, the first MOSFET, and the charge discharge circuit are integrally provided on one semiconductor substrate.

* * * * *